(12) United States Patent
Dong et al.

(10) Patent No.: US 9,304,913 B2
(45) Date of Patent: Apr. 5, 2016

(54) MIXED MEMORY TYPE HYBRID CACHE

(71) Applicant: QUALCOMM Incorporated, San Diego, CA (US)

(72) Inventors: Xiangyu Dong, La Jolla, CA (US); Jungwon Suh, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 330 days.

(21) Appl. No.: 13/843,190

(22) Filed: Mar. 15, 2013

(65) Prior Publication Data

US 2014/0281184 A1 Sep. 18, 2014

(51) Int. Cl.

| G06F 12/00 | (2006.01) |
|---|---|
| G06F 12/08 | (2006.01) |
| G11C 11/16 | (2006.01) |
| G11C 11/00 | (2006.01) |
| G11C 13/00 | (2006.01) |

(52) U.S. Cl.
CPC ............ *G06F 12/0802* (2013.01); *G06F 12/08* (2013.01); *G06F 12/0893* (2013.01); *G11C 11/005* (2013.01); *G11C 11/1659* (2013.01); *G11C 13/0002* (2013.01); *G11C 13/004* (2013.01); *G11C 13/0069* (2013.01); *G06F 2212/205* (2013.01); *G06F 2212/2024* (2013.01); *G06F 2212/225* (2013.01); *G11C 2207/2245* (2013.01); *Y02B 60/1225* (2013.01)

(58) Field of Classification Search
None
See application file for complete search history.

(56) References Cited

U.S. PATENT DOCUMENTS

| 6,292,426 | B1 | 9/2001 | Ikeda et al. | |
|---|---|---|---|---|
| 7,568,068 | B2 | 7/2009 | Kulkarni et al. | |
| 7,613,877 | B2 | 11/2009 | Shimozono et al. | |
| 2008/0126716 | A1* | 5/2008 | Daniels | 711/154 |
| 2011/0153916 | A1 | 6/2011 | Chinnaswamy et al. | |
| 2012/0233377 | A1* | 9/2012 | Nomura et al. | 711/3 |
| 2012/0246412 | A1 | 9/2012 | Nomura et al. | |

OTHER PUBLICATIONS

International Search Report and Written Opinion—PCT/US2014/025971—ISA/EPO—Jul. 29, 2014.
Jang H., et al., "A Hybrid Buffer Design with STT-MRAM for On-Chip Interconnects", 2012 IEEE/ACM Sixth International Symposium on Networks-On Chip, May 1, 2012, pp. 193-200, XP055129306, DOI: 10.1109/NOCS.2012.30 ISBN: 978-0-76-954677-3 Chapter B.An On-Chip Router Architecture with Hybrid Buffer Design, p. 196-197.

(Continued)

*Primary Examiner* — Daniel Tsui
(74) *Attorney, Agent, or Firm* — Seyfarth Shaw LLP

(57) ABSTRACT

A hybrid cache includes a static random access memory (SRAM) portion and a resistive random access memory portion. Cache lines of the hybrid cache are configured to include both SRAM macros and resistive random access memory macros. The hybrid cache is configured so that the SRAM macros are accessed before the resistive random memory macros in each cache access cycle. While SRAM macros are accessed, the slower resistive random access memory reach a data access ready state.

20 Claims, 12 Drawing Sheets

(56) References Cited

OTHER PUBLICATIONS

Saripalli V., et al., "Exploiting Heterogeneity for Energy Efficiency in Chip Multiprocessors", IEEE Journal on Emerging and Selected Topics in Circuits and Systems, IEEE, Piscataway, NJ, USA, vol. 1, No. 2, Jun. 1, 2011, pp. 109-119, XP011381025, ISSN: 2156-3357, DOI: 10.1109/JETCAS.2011.2158343 Chapter B.Hybrid SRAM-MRAM Architecture, p. 6-8.

Sun G., et al., "A novel architecture of the 3D stacked MRAM L2 cache for CMPs", High Performance Computer Architecture, 2009. HPCA 2009. IEEE 15th International Symposium on, IEEE, Piscataway, NJ, USA, Feb. 14, 2009, pp. 239-249, XP031435382, ISBN: 978-1-4244-2932-5 Chapter 5.2 SRAM-MRAM Hybrid L2 Cache, p. 246-247.

* cited by examiner

|  | | Cycle 1 | Cycle 2 | Cycle 3 | Cycle 4 | Cycle 5 | Cycle 6 | Cycle 7 | Cycle 8 | Cycle 9 |
|---|---|---|---|---|---|---|---|---|---|---|
| Block | QW0 | Enable | Array access | Array access | Data Out Ready | | | | | |
| Block | QW1 | Enable | Array access | Array access | Data Out Ready | | | | | |
| Block | QW2 | Enable | Array access | Array access | Data Out Ready | | | | | |
| Block | QW3 | Enable | Array access | Array access | Data Out Ready | | | | | |
| Bus | | - | - | - | - | QW0 | QW1 | QW2 | QW3 | |

FIG. 5A

|  | | Cycle 1 | Cycle 2 | Cycle 3 | Cycle 4 | Cycle 5 | Cycle 6 | Cycle 7 | Cycle 8 | Cycle 9 | Cycle 10 |
|---|---|---|---|---|---|---|---|---|---|---|---|
| Block | QW0 | Enable | Array access | Array access | Array access | Array access | Data Out Ready | | | | |
| Block | QW1 | Enable | Array access | Array access | Array access | Array access | Data Out Ready | | | | |
| Block | QW2 | Enable | Array access | Array access | Array access | Array access | Data Out Ready | | | | |
| Block | QW3 | Enable | Array access | Array access | Array access | Array access | Data Out Ready | | | | |
| Bus | | - | - | - | - | | | | QW0 | QW1 | QW2 | QW3 |

FIG. 5B

|  | Cycle 1 | Cycle 2 | Cycle 3 | Cycle 4 | Cycle 5 | Cycle 6 | Cycle 7 | Cycle 8 | Cycle 9 | Cycle 10 | Cycle 11 | Cycle 12 | Cycle 13 |
|---|---|---|---|---|---|---|---|---|---|---|---|---|---|
| Block QW0 | Enable | Array access | Array access | Data Out Ready | | | | | | | | | |
| Block QW1 | Enable | Array access | Array access | Data Out | Ready | | | | | | | | |
| Block QW2 | Enable | Array access | Array access | Array access | Array access | Array access | Data Out Ready | | | | | | |
| Block QW3 | Enable | Array access | Array access | Array access | Array access | Array access | Array access | Data Out Ready | | | | | |
| Block QW4 | , | , | Enable | Array access | Array access | Array access | Array access | Array access | Array access | Data Out Ready | | | |
| Block QW5 | | | Enable | Array access | Array access | Array access | Array access | Array access | Array access | Data Out Ready | | | |
| Block QW6 | | | Enable | Array access | Array access | Array access | Array access | Array access | Array access | Array access | Data Out Ready | | |
| Block QW7 | | | Enable | Array access | Array access | Array access | Array access | Array access | Array access | Array access | Data Out Ready | | |
| Bus | | | | | QW0 | QW1 | QW4 | QW5 | QW2 | QW3 | QW6 | QW7 | |

*FIG. 9*

MIXED MEMORY TYPE HYBRID CACHE

TECHNICAL FIELD

The present disclosure generally relates to memory caches. More specifically, the present disclosure relates to memory cache lines operating with different types of memory.

BACKGROUND

Unlike conventional random access memory (RAM) chip technologies, in magnetic RAM (MRAM) data is not stored as electric charge, but is instead stored by magnetic polarization of storage elements. The storage elements are formed from two ferromagnetic layers separated by a tunneling layer. One of the two ferromagnetic layers, which is referred to as the fixed layer or pinned layer, has a magnetization that is fixed in a particular direction. The other ferromagnetic magnetic layer, which is referred to as the free layer, has a magnetization direction that can be altered to represent either a "1" when the free layer magnetization is anti-parallel to the fixed layer magnetization or "0" when the free layer magnetization is parallel to the fixed layer magnetization or vice versa. One such device having a fixed layer, a tunneling layer, and a free layer is a magnetic tunnel junction (MTJ). The electrical resistance of an MTJ depends on whether the free layer magnetization and fixed layer magnetization are parallel or anti-parallel with each other. A memory device such as MRAM is built from an array of individually addressable MTJs.

To write data in a conventional MRAM, a write current, which exceeds a critical switching current, is applied through an MTJ. The write current exceeding the critical switching current is sufficient to change the magnetization direction of the free layer. When the write current flows in a first direction, the MTJ can be placed into or remain in a first state, in which its free layer magnetization direction and fixed layer magnetization direction are aligned in a parallel orientation. When the write current flows in a second direction, opposite to the first direction, the MTJ can be placed into or remain in a second state, in which its free layer magnetization and fixed layer magnetization are in an anti-parallel orientation.

To read data in a conventional MRAM, a read current flows through the MTJ via the same current path used to write data in the MTJ. If the magnetizations of the MTJ's free layer and fixed layer are oriented parallel to each other, the MTJ presents a resistance that is different than the resistance the MTJ would present if the magnetizations of the free layer and the fixed layer were in an anti-parallel orientation. In a conventional MRAM, two distinct states are defined by two different resistances of an MTJ in a bitcell of the MRAM. The two different resistances represent a logic "0" and a logic "1" value stored by the MTJ.

BRIEF SUMMARY

A hybrid cache apparatus according to an aspect of the present disclosure includes a first type of memory and a second type of memory. A first cache line of the hybrid cache apparatus includes a first memory location in the first type of memory and a second memory location in the second type of memory. The first cache line is configured for accessing the first memory location before accessing the second memory location during a cache accessing operation.

Another aspect of the present disclosure includes a method for accessing a hybrid cache apparatus. The method includes storing a first portion of cached information in a first type of memory of a first cache line, and storing a second portion of the cached information in a second type of memory of the first cache line. The method also includes accessing the first portion of the cached information before accessing the second portion of the cached information during a cache accessing operation.

A hybrid cache apparatus according to another aspect of the present disclosure includes means for storing a first portion of cached information in a static random access memory (SRAM) location of a first cache line and means for storing a second portion of the cached information in a resistive random access memory portion of the first cache line. The hybrid cache apparatus also includes means for accessing the first portion of the cached information before accessing the second portion of the cached information during a cache accessing operation.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

DESCRIPTION OF THE DRAWINGS

For a more complete understanding of the present disclosure, reference is now made to the following description taken in conjunction with the accompanying drawings.

FIG. 5A is an SRAM cache pipeline timing diagram.

FIG. 5B is an MRAM cache pipeline timing diagram.

FIG. 9 is a cache pipeline timing diagram for a hybrid SRAM-MRAM cache according to an aspect of the present disclosure.

DETAILED DESCRIPTION

Figure 1:
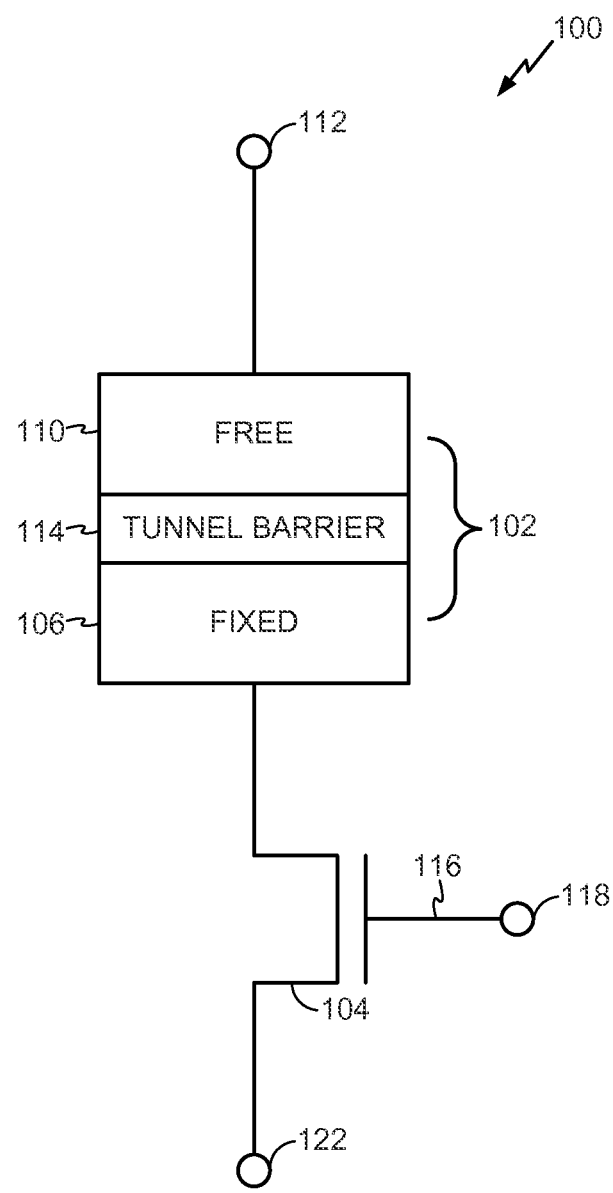
FIG. 1 is a diagram of a resistive memory element.

FIG. 1 illustrates a resistive memory element 100 including a magnetic tunnel junction (MTJ) 102 coupled to an access transistor 104. A free layer 110 of the MTJ 102 is coupled to a bit line 112. The access transistor 104 is coupled between a fixed layer 106 of the MTJ 102 and a fixed potential node 122. A tunnel barrier layer 114 is coupled between the fixed layer 106 and the free layer 110. The access transistor 104 includes a gate 116 coupled to a word line 118.

Synthetic anti-ferromagnetic materials may be used to form the fixed layer 106 and the free layer 110. For example, the fixed layer 106 may comprise multiple material layers including a CoFeB, and Ru layer and a CoFe layer. The free layer 110 may be an anti-ferromagnetic material such as CoFeB, and the tunnel barrier layer 114 may be MgO, for example.

Figure 2:
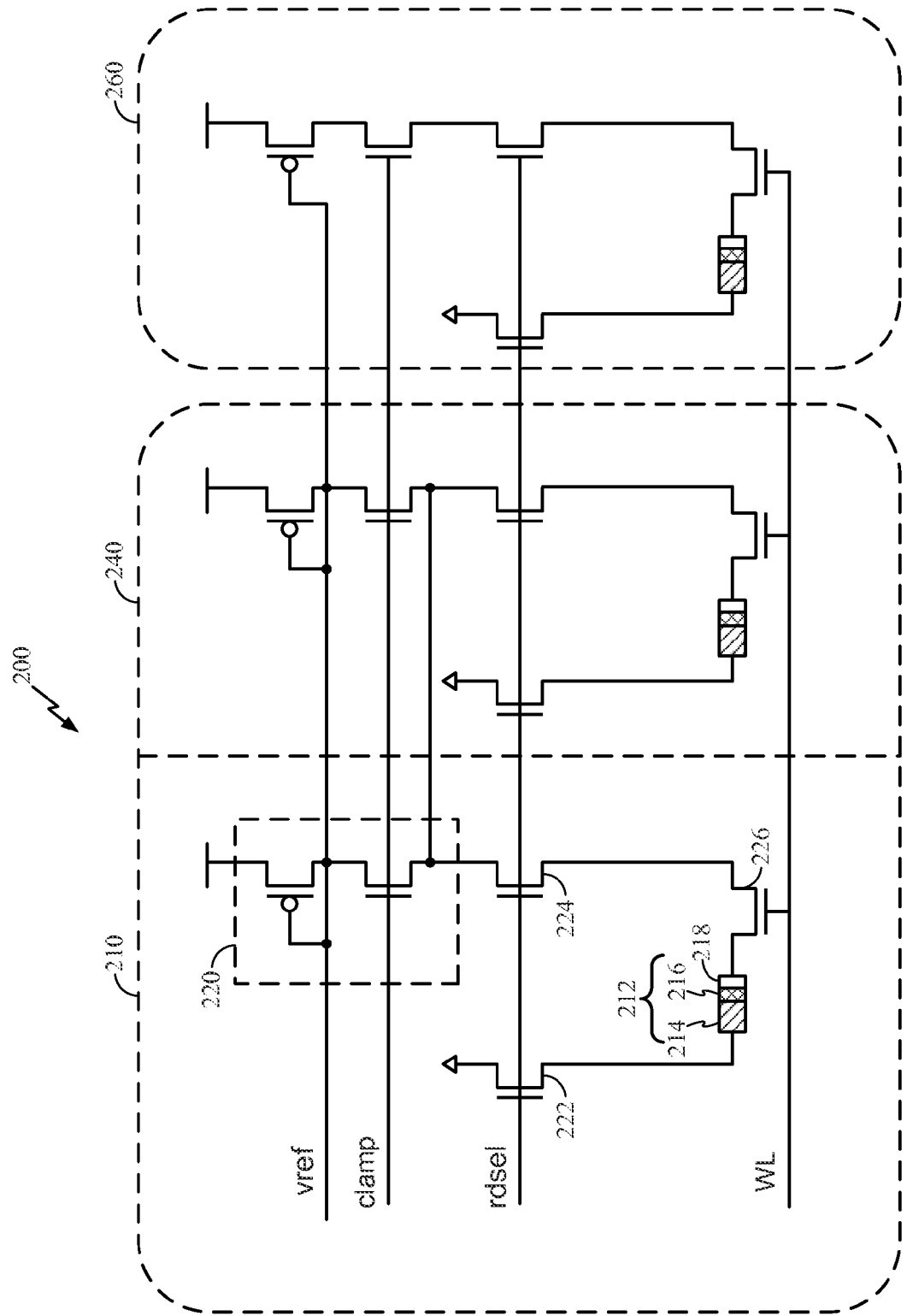
FIG. 2 is a diagram of a resistive memory device and circuitry for programming and reading the resistive device.

FIG. 2 is a circuit schematic illustrating a portion of a conventional magnetic random access memory (MRAM) 200. An MRAM 200 is divided into a data circuit 260, and reference circuits 240, 210, each circuit 210, 240, 260 including multiple bitcells 212, 226 (only a single bitcell is illustrated to facilitate understanding). During read out of the bitcell of the data circuit 260, the resistance of the magnetic tunnel junction is compared to the effective resistance of two reference MTJs connected in parallel, where one is the reference parallel MTJ of the reference circuit 210 and the other is the reference anti-parallel MTJ of the circuit 240. Resistance of the bitcells is measured by applying a source voltage and determining an amount of current flowing through the bitcells. For example, in the bitcell of the parallel reference circuit 210, a current source 220 is applied to a magnetic tunnel junction (MTJ) 212 by read select transistors 222, 224, and a word line select transistor 226. The MTJ 212 includes a fixed layer 214, tunneling layer 216, and a free layer 218. When the free layer 218 and the fixed layer 214 have magnetizations aligned substantially parallel, the resistance of the MTJ 212, and thus the bitcell 210, is low. When the free layer 218 and the fixed layer 214 have magnetizations aligned substantially anti-parallel, the resistance of the MTJ 212, and thus the bitcell 210, is high.

Bitcells of a magnetic random access memory (MRAM) may be arranged in one or more arrays including a pattern of memory elements (e.g., MTJ in case of MRAM). Spin-Transfer-Torque Magnetic Random Access Memory (STT-MRAM) is an emerging nonvolatile memory and its advantages of non-volatility, comparable speed to Dynamic Random Access Memory (DRAM), smaller chip size compared to Static Random Access Memory (SRAM), unlimited read/write endurance, and low array leakage current have opened a great opportunity to Spin-Transfer-Torque Magnetic Random Access Memory (STT-MRAM) as a universal working memory in System on Chip (SoC) design.

In resistive memory array, a reference level for read sensing is generated upon activation of a word line (WL) by assertion of a read enable signal. The generation of a reference level in resistive memories results in a longer memory access cycle. For example, in an MRAM array, after activation of the WL, five clock cycles may elapse including to accommodate a settling time for the data circuit 260 and reference circuits 240, 210 before an MRAM bitcell may reach a data out ready state. In comparison, SRAM memory cells may be accessed in three clock cycles.

Figure 3:
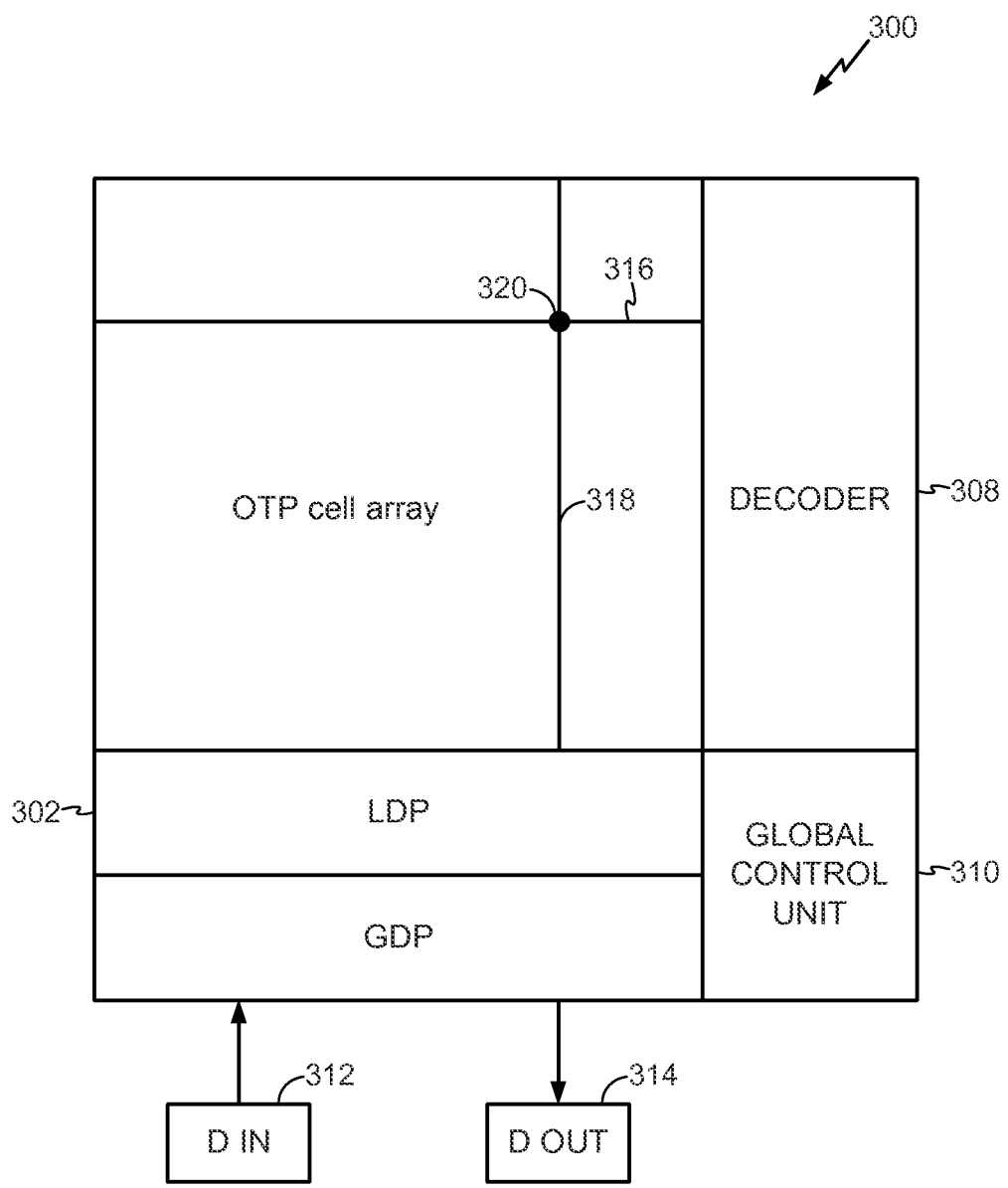
FIG. 3 is a diagram of a memory macro.

FIG. 3 illustrates a memory macro 300. The macro 300 may include a local data path (LDP) 302, a global data path (GDP) 304, a cell array 306, a decoder 308, and a global control unit 310. The LDP 302 includes one or more sense amplifiers and a programming write driver (not shown). The GDP 304 includes circuitry for input and output signal lines or pins, such as a DIN 312 and a D OUT 314.

The cell array 306 includes multiple rows corresponding to word lines, for example a WL 316 and multiple columns corresponding to bit lines, for example a bit line 318. For example, the cell array 306 may have 64 rows for word lines and 256 bits for bit lines. The cell array 306 includes numerous unit cells such as a unit cell 320, coupled to the word line 316 and the bit line 318. The memory macro 300 may be implemented using various memory cell technologies in which each unit cell in the memory macro 300 includes a similarly constructed memory element. For example, in a resistive memory macro, each unit cell 320 includes a resistive memory element 100 as described with reference to FIG. 1.

A cache memory may include a number of macros coupled to a cache interface. An MRAM cache includes banks of MRAM macros coupled to the cache interface. An SRAM cache includes banks of SRAM macros coupled to the cache interface. SRAM macros have an advantage of being faster than resistive memory macros such as MRAM macros. Resistive memory macros such as MRAM macros exhibit longer read latency than SRAM due to difficult bitcell sensing and longer write latency due to difficult status switching. However, SRAM macros are volatile, consume more leakage energy and are substantially larger than MRAM macros. For example, the size of an SRAM bitcell is about 200 $F^2$, where F is the minimum feature size of a chip. An SRAM last-level cache may consume about 50% of a modern central processing unit (CPU) area. In contrast, MRAM macros are non-volatile and are energy efficient when idle. The size of an MRAM bitcell is only about 4 $F^2$. Due to their small size, MRAM macros are suitable for larger level 2 and level 3 (L2/L3) on-chip cache integration.

Figure 4:
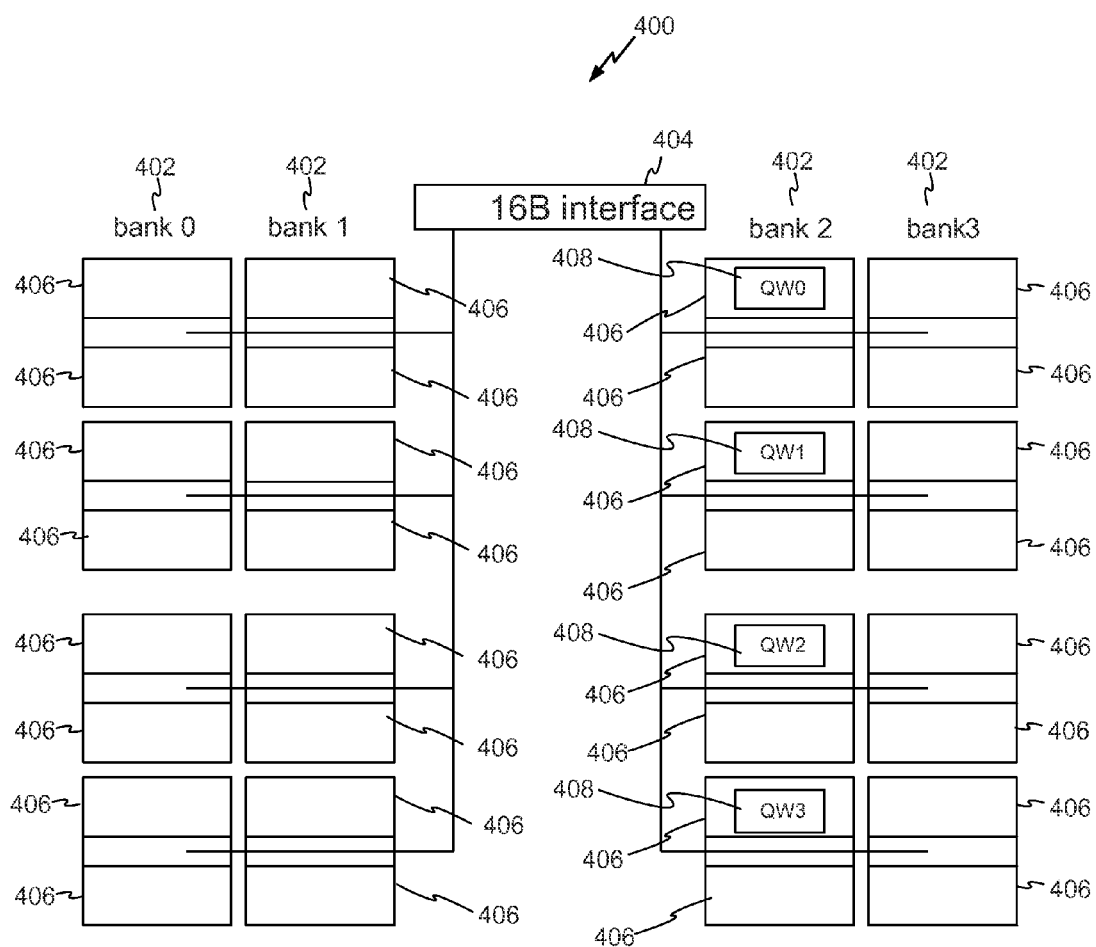
FIG. 4 is a diagram of a prior art SRAM cache.

An example of an SRAM cache architecture is described with reference to FIG. 4. The SRAM cache 400 includes four banks 402 coupled to a cache interface 404. Each bank 402 includes a number of SRAM macros 406. In this example, the cache interface 404 is 16 bytes wide and thus is able to access one quad word (QW) 408 of memory at a time, in which each QW 408 is 16 bytes of memory in an SRAM macro 406. During a cache access, a fixed amount of data is written to or read from the cache. The memory associated with the fixed amount of data for a cache line is referred to herein as a cache line. A 64 byte cache line includes four QWs 408 in a bank 402, in which each of the QWs 408 is in a respective SRAM macro 406. A 64 byte cache access is divided into four QW accesses, in which each QW accesses reads to or writes from one of the SRAM macros 406 on the cache line.

Timing of an SRAM cache line access is described with reference to an SRAM cache line access diagram 500 in FIG. 5A. In this example, an SRAM macro read access or write access uses three clock cycles including an enable cycle and two array access cycles. Thus, cycle 1-cycle 3 elapse before each of the SRAM macros can reach a data out ready state. Another cycle is used to clock each QW to or from the data bus so the four QWs (QW0-QW3) of the SRAM cache line reach the data bus in cycle 5-cycle 8.

The slower operation of an MRAM cache line access is described with reference to an MRAM cache line access diagram 550 in FIG. 5B. In this example, an MRAM macro read access or write access uses five clock cycles including an enable cycle and four array access cycles. Thus, cycle 1-cycle 5 elapse before each of the MRAM macros can reach a data out ready state. Another clock cycle is used to clock each QW onto the data, so the four QWs (QW0-QW3) of the MRAM cache line reach the data bus in cycle 7-cycle 10.

According to aspects of the present disclosure, MRAM macros may be used for storing non-critical QWs in which it is tolerable to allow an access delay of two or more clock cycles. The use of larger, less energy efficient SRAM macros may be reserved for situations in which such a delay is not tolerable. Referring to FIGS. 5A and 5B, according to aspects of the present disclosure, SRAM macros may be configured on a cache line to provide QWs in cycle 5 and cycle 6 of a memory access and MRAM macros may be configured to provide QWs in cycle 7 and cycle 8 of the memory access.

Further the first QW of a cache line often includes the most critical data of a memory access and the remaining QWs may include less critical information. In such configurations it is desirable to provide fast access to the first QW of a cache line but slower access to the remaining QWs of a cache line may be tolerable. According to aspects of the present disclosure, the first QW of a cache line may be stored in an SRAM macro and one or more of the remaining QWs may be stored in an MRAM macro. According to another aspect of the present disclosure, the first QW of a cache line may be configured for storing critical words of cached information.

A hybrid SRAM-MRAM cache line including both SRAM macros and MRAM macros, according to an aspect of the present disclosure, is described with reference to FIG. 6. The hybrid SRAM-MRAM cache 600 includes four banks 602 coupled to a cache interface 604. Each bank 602 includes a number of SRAM macros 606 and a number of MRAM macros 607 coupled to the cache interface 604. In this example, the cache interface 604 is 16 bytes wide and thus is able to access one 16 byte quad word (QW) 608 of memory at a time. A 64 byte cache line includes two QWs 608 in SRAM macros 606 of a bank 602, and two QWs 608 in MRAM macros 607 of the bank. A 64 byte cache access is divided into four QW accesses in which the first two QW accesses read to or write from the SRAM macros 606 on the cache line and the second two QW accesses read to or write from the MRAM macros 607 on the cache line.

Figure 6:
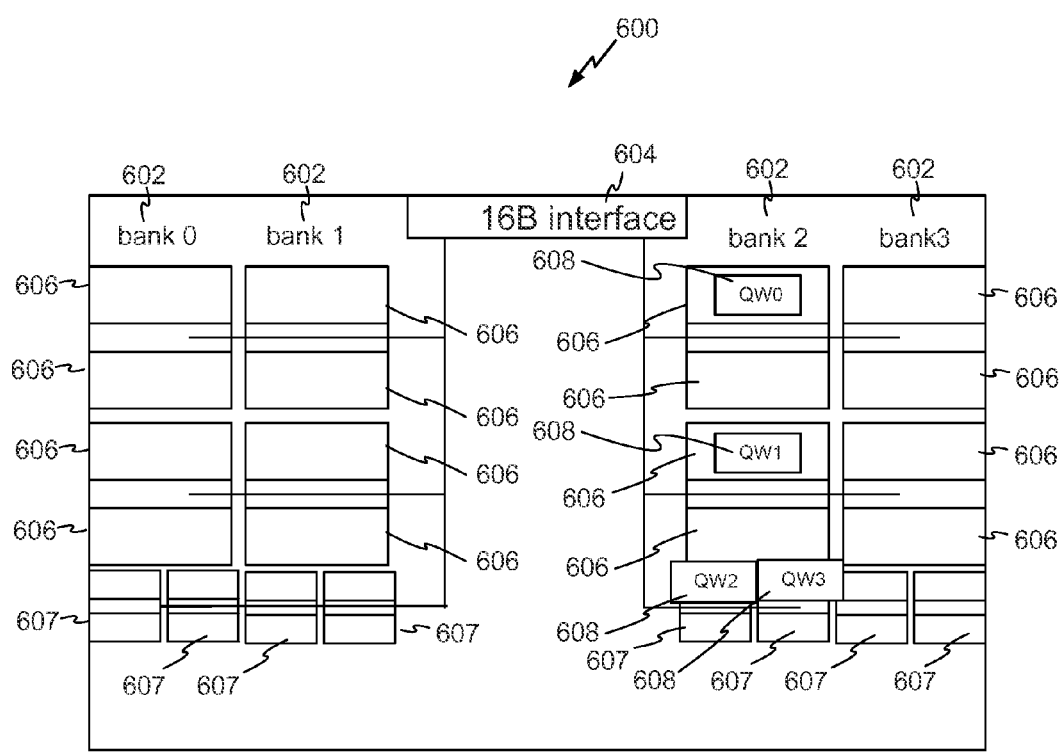
FIG. 6 is a diagram of a hybrid SRAM-MRAM cache according to an aspect of the present disclosure.
Figure 7:
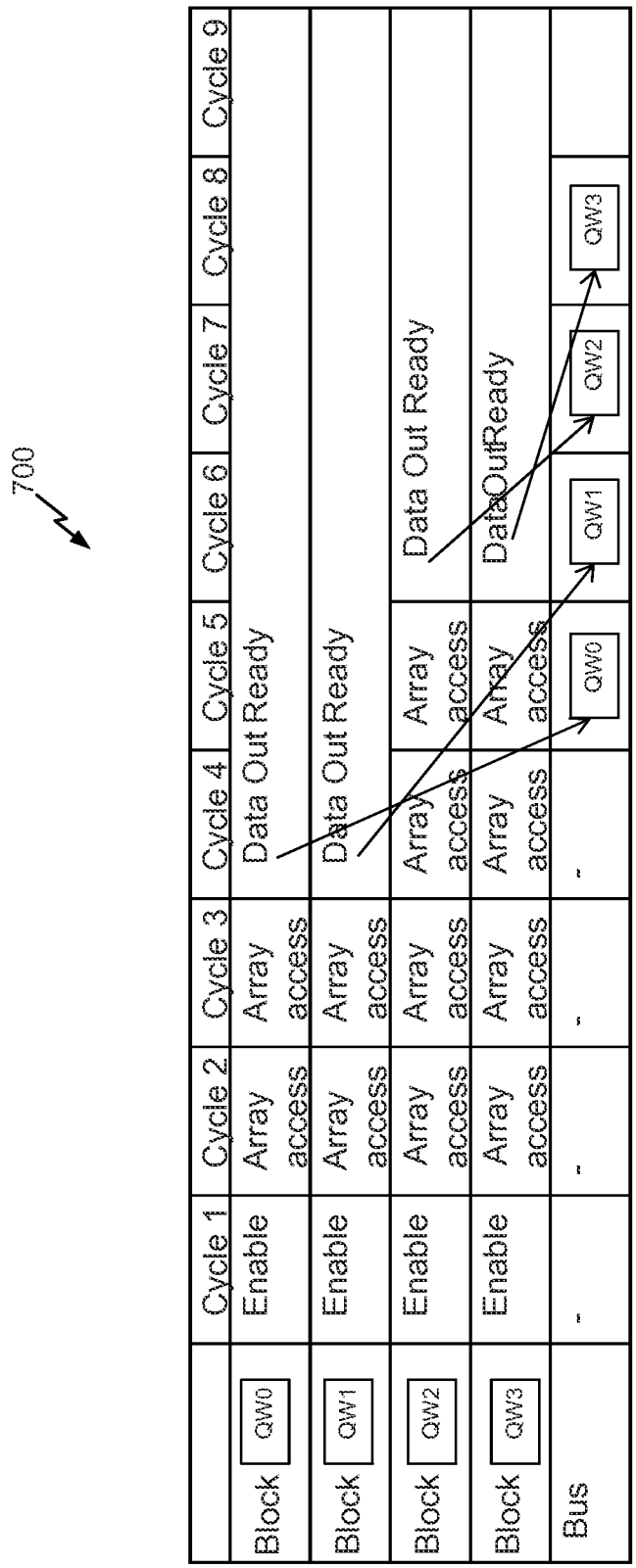
FIG. 7 is a cache pipeline timing diagram for a hybrid SRAM-MRAM cache according to an aspect of the present disclosure.

Timing of a hybrid SRAM-MRAM cache line access in the implementation shown in FIG. 6 is described with reference to the cache line access diagram 700 in FIG. 7. In this implementation, each SRAM macro read access or write access uses three clock cycles including an enable cycle and two array access cycles. Each MRAM macro read access or write access uses five clock cycles including an enable cycle and four array access cycles. An SRAM macro read access or write access is used to access the first two QWs (QW0 and QW1) of a cache line. Clock cycle 1-cycle 3 elapse before the SRAM macros can reach a data out ready state. A next clock cycle (cycle 4) is used to clock the first QW of the cache line (QW0) to or from the data bus. The following clock cycle (cycle 5) is then used to clock the second QW of the cache line (QW1) to or from the data bus. An MRAM macro read access or write access is used to access the newt two QWs (QW2 and QW3) of the cache line. The MRAM macros reach a data out ready state in clock cycle 6. Clock cycles 6 and 7 are used to clock the third QW (QW2) of the cache line and the fourth QW (QW3) of the cache line to or from the data bus.

In the implementation of a hybrid SRAM-MRAM cache shown in FIG. 6, the number of SRAM macros and MRAM macros in a cache line are chosen so that the cache line access pipeline is matched to the difference between the SRAM macro access time of three clock cycles and the MRAM macro access time of five clock cycles. In another implementation, according to an aspect of the present disclosure the cache line access pipeline may not be perfectly matched to the difference between the SRAM macro access time and the MRAM macro access time. Accesses to more than one cache line may be interleaved in order to accommodate additional clock cycles that may elapse before MRAM macros are in a data access ready state. An implementation of a pair of interleaved hybrid SRAM-MRAM cache lines, according to an aspect of the present disclosure, is described with reference to FIG. 8.

A hybrid SRAM-MRAM cache line including both SRAM macros and MRAM macros according to an aspect of the present disclosure is described with reference to FIG. 8. The hybrid SRAM-MRAM cache 800 includes four banks 801-804 coupled to a cache interface 806. Each bank 801-804 includes a number of SRAM macros 808 and a number of MRAM macros 809 coupled to the cache interface 806. In this example, the cache interface 806 is 16 bytes wide and thus is able to access one 16 byte quad word (QW) 810 of memory at a time. A first 64 byte cache line includes two QWs 810 in SRAM macros 808 of a first bank 803, and two QWs 810 in MRAM macros 809 of the first bank 803. A second 64 bit cache line includes two QWs 810 in SRAM macros 808 of a second bank 804 and two QWs 810 in MRAM macros 809 of the second bank 804.

A first 64 byte cache access is divided into four QW accesses, in which the first two QWs (QW0 and QW1) are read to or written from the SRAM macros 808 on the first cache line and the second two QWs (QW2 and QW3) are read to or written from the MRAM macros 809 on the first cache line. A second 64 byte cache access is divided into four QW accesses, in which the first two QWs (QW4 and QW5) are read to or written from the SRAM macros 808 on the second cache line and the second two QWs (QW6 and QW7) are read to or written from the MRAM macros 809 on the second cache line.

Figure 8:
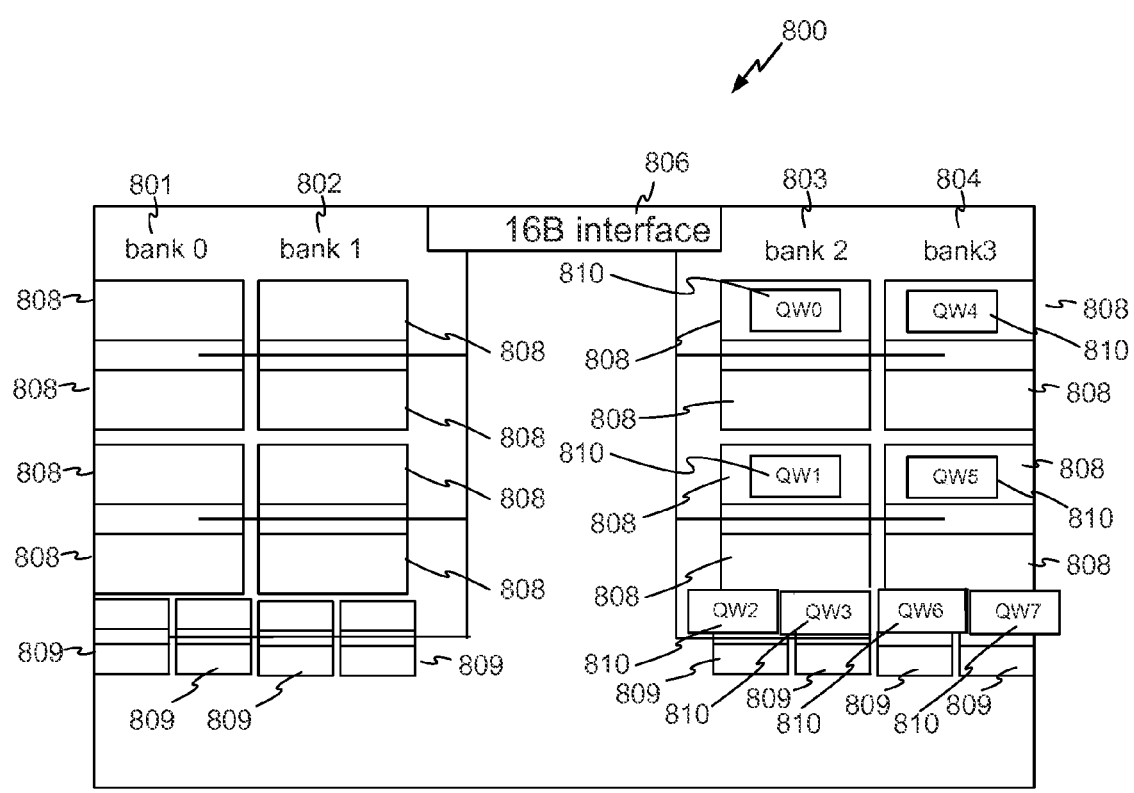
FIG. 8 is a diagram of a hybrid SRAM-MRAM cache according to an aspect of the present disclosure.

Timing of a hybrid SRAM-MRAM cache line access in the implementation shown in FIG. 8 is described with reference to the cache line access diagram 900 in FIG. 9. In this implementation, each SRAM macro read access or write access uses three clock cycles including an enable cycle and two array access cycles. Each MRAM macro read access or write access uses seven clock cycles including an enable cycle and six array access cycles. A first SRAM macro read access or write access is used to access the first two QWs (QW0 and QW1) of the first cache line. Clock cycles 1-cycle 3 elapse before the SRAM macros can reach a data out ready state. A next clock cycle (cycle 4) is used to clock the first QW of the first cache line (QW0) to or from the data bus. The following clock cycle (cycle 5) is then used to clock the second QW of the first cache line (QW1) to or from the data bus.

In this implementation, because the MRAM macro access takes seven clock cycles, they do not reach a data access ready state until clock cycle 8. To avoid idle cycles on the cache interface 806, a second cache line access begins while waiting for the MRAM macros on the first cache line to reach a data out ready state. Clock cycle (cycle 6) is used to clock the first QW of the second cache line (QW4) to or from the data bus. The following clock cycle (cycle 7) is then used to clock the second QW of the second cache line (QW5) to or from the data bus.

An MRAM macro read access or write access is used to access the next two QWs (QW2 and QW3) of the first cache line. The MRAM macros on the first cache line reach a data out ready state in clock cycle 8. Clock cycles 8 and 9 are used to clock the third QW (QW2) of the first cache line and the fourth QW (QW3) of the first cache line to or from the data bus. The MRAM macros on the second cache line reach a data out ready state in clock cycle 10. Clock cycles 10 and 11 are used to clock the third QW (QW6) of the second cache line and the fourth QW (QW7) of the second cache line to or from the data bus.

Figure 10:
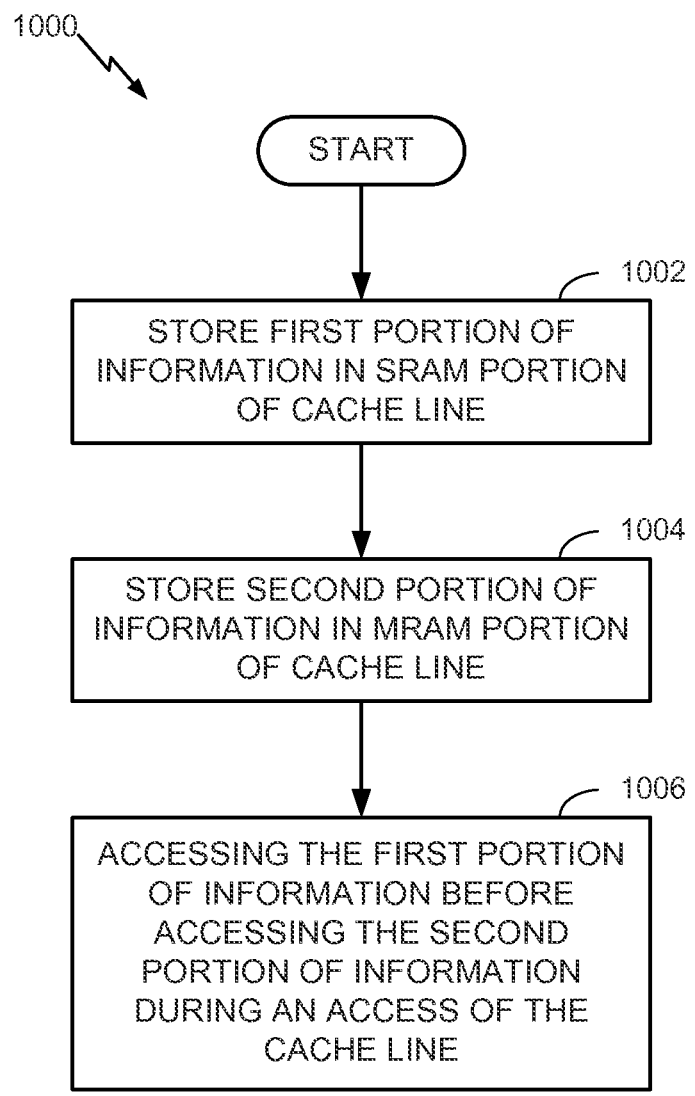
FIG. 10 is process flow diagram illustrating a method of accessing a hybrid SRAM-MRAM cache according to an aspect of the present disclosure.

FIG. 10 is a process flow diagram illustrating a method of accessing a cache memory according to an aspect of the present disclosure. The method 1000 includes, storing a first portion of cached information in a static random access memory (SRAM) location of a cache line at block 1002, and storing a second portion of the cached information in a resistive random access memory location of the cache line at block 1004. The method also includes accessing the first portion of the information before accessing the second portion of the information during a cache accessing operation, at block 1006.

A hybrid SRAM-MRAM cache according to another aspect of the present disclosure includes means for storing a first portion of cached information in an SRAM location of a cache line and means for storing a second portion of the cached information in a resistive memory location of the cache line. The cache also has means for accessing the first portion of the information before accessing the second portion. The means storing the first portion of cached information may include the SRAM macros 606 as shown in FIG. 6, for example. The means for storing the second portion of the cached information may include the MRAM macros 607 as shown in FIG. 6, for example. The means for accessing may include the cache interface 604, the SRAM macros 606 and the MRAM macros 608 as shown in FIG. 6, for example.

In another configuration, the aforementioned means may be any module or any apparatus configured to perform the functions recited by the aforementioned means. Although specific means have been set forth, it will be appreciated by those skilled in the art that not all of the disclosed means are required to practice the disclosed configurations. Moreover, certain well known means have not been described, to maintain focus on the disclosure.

Figure 11:
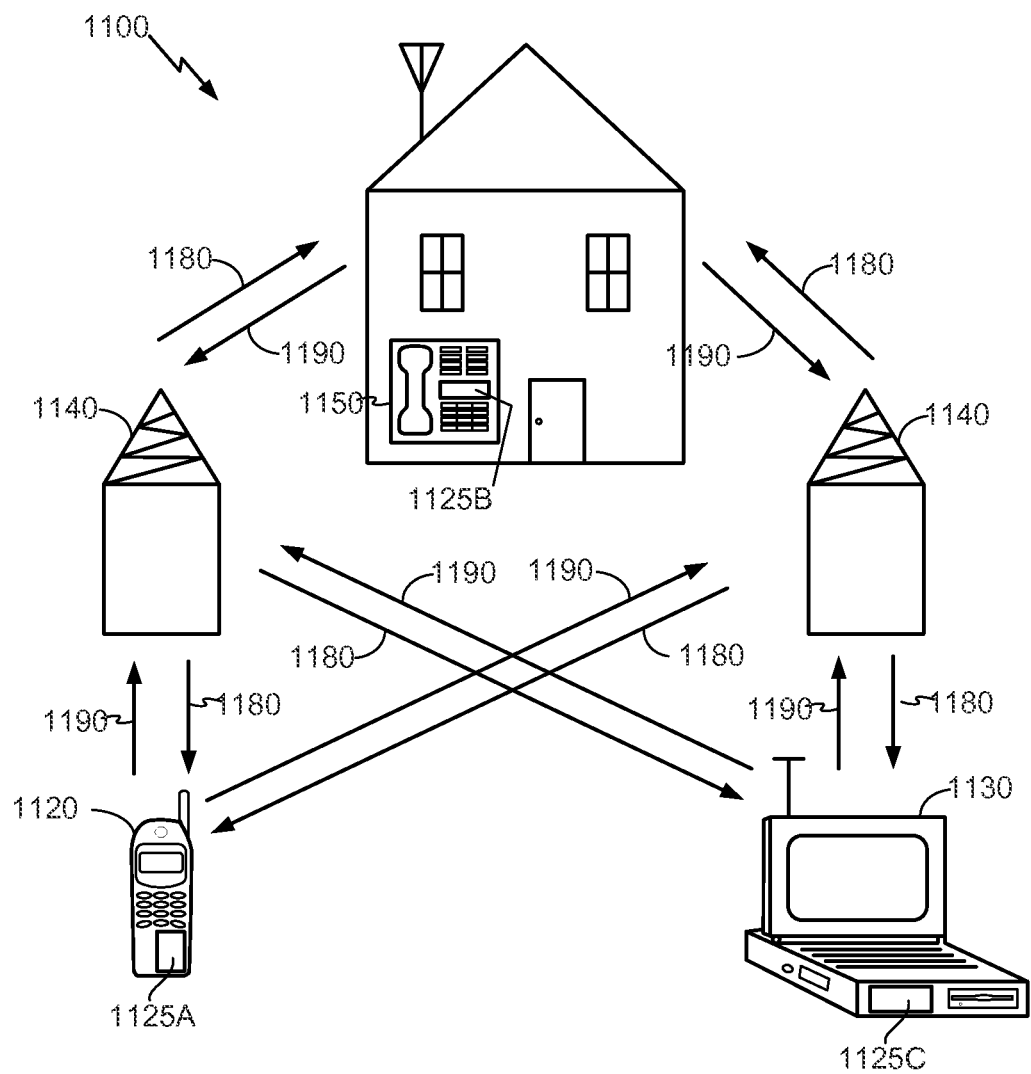
FIG. 11 is a block diagram showing an exemplary wireless communication system in which a configuration of the disclosure may be advantageously employed.

FIG. 11 is a block diagram showing an exemplary wireless communication system 1100 in which an aspect of the disclosure may be advantageously employed. For purposes of illustration, FIG. 11 shows three remote units 1120, 1130, and 1150 and two base stations 1140. It will be recognized that wireless communication systems may have many more remote units and base stations. Remote units 1120, 1130, and 1150 include IC devices 1125A, 1125C and 1125B that include the disclosed hybrid cache apparatus. It will be recognized that other devices may also include the disclosed hybrid cache apparatus, such as the base stations, switching devices, and network equipment. FIG. 11 shows forward link signals 1180 from the base station 1140 to the remote units 1120, 1130, and 1150 and reverse link signals 1190 from the remote units 1120, 1130, and 1150 to base stations 1140.

In FIG. 11 remote unit 1120 is shown as a mobile telephone, remote unit 1130 is shown as a portable computer, and remote unit 1150 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 11 illustrates remote units according to the teachings of the disclosure, the disclosure is not limited to these exemplary illustrated units. Aspects of the disclosure may be suitably employed in many devices which include the disclosed hybrid cache apparatus.

Figure 12:
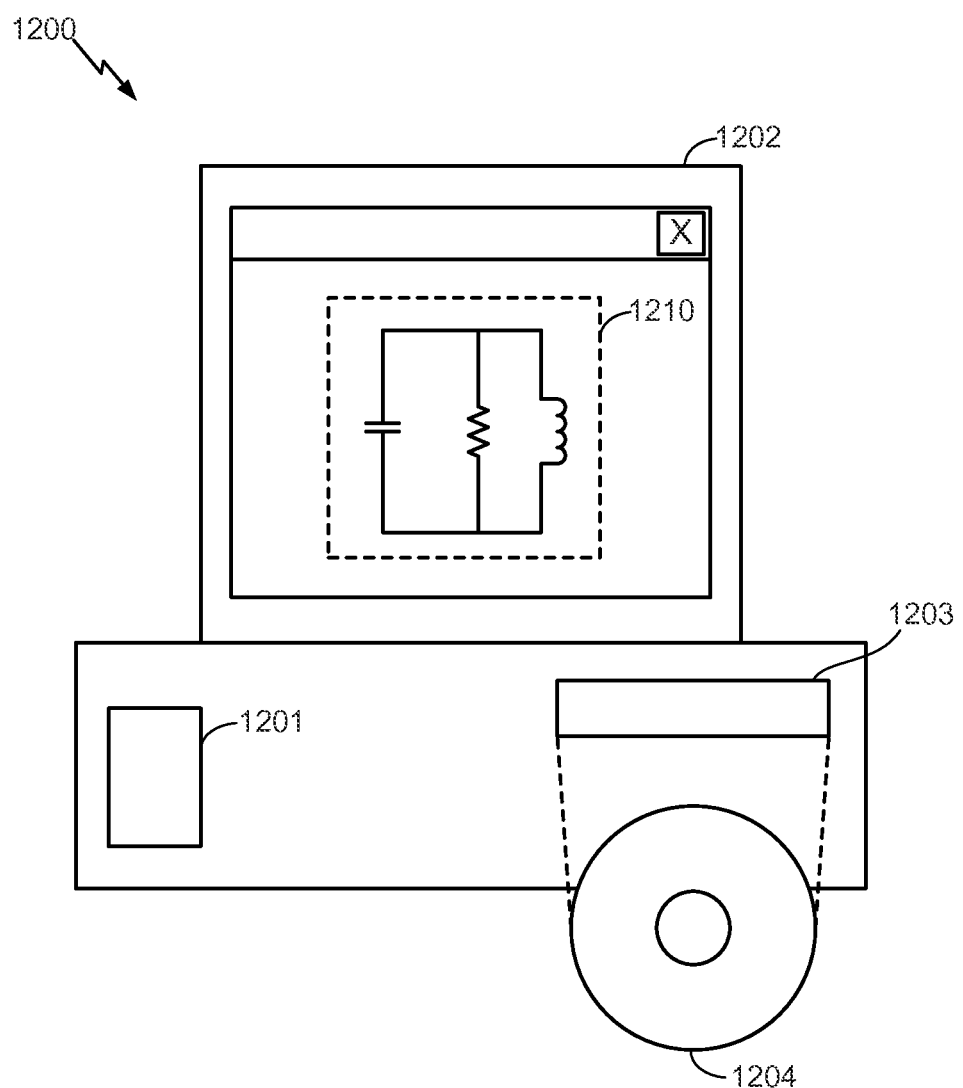
FIG. 12 is a block diagram illustrating a design workstation used for circuit, layout, and logic design of a semiconductor component according to one configuration.

FIG. 12 is a block diagram illustrating a design workstation used for circuit, layout, and logic design of a semiconductor component, such as the hybrid cache apparatus disclosed above. A design workstation 1200 includes a hard disk 1201 containing operating system software, support files, and design software such as Cadence or OrCAD. The design workstation 1200 also includes a display 1202 to facilitate design of a circuit design 1210 or a semiconductor component 1212 such as a hybrid cache apparatus. A storage medium 1204 is provided for tangibly storing the circuit design 1210 or the semiconductor component 1212. The circuit design 1210 or the semiconductor component 1212 may be stored on the storage medium 1204 in a file format such as GDSII or GERBER. The storage medium 1204 may be a CD-ROM, DVD, hard disk, flash memory, or other appropriate device. Furthermore, the design workstation 1200 includes a drive apparatus 1203 for accepting input from or writing output to the storage medium 1204.

Data recorded on the storage medium 1204 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1204 facilitates the design of the circuit design 1210 or the semiconductor component 1212 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, although SRAM and MRAM were described as types of memories, other memory types are also contemplated, such as DRAM, PCRAM, etc. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A hybrid cache apparatus, comprising:
a first type of memory;
a second type of memory;
a first memory bank including the first type of memory and the second type of memory; and
a first cache line including a first memory location in the first type of memory and a second memory location in the second type of memory within the first memory bank, the first cache line configured for accessing the first memory location before accessing the second memory location within the first memory bank during a cache accessing operation.

2. The hybrid cache apparatus of claim 1, in which the first memory location comprises a first word location of the first cache line.

3. The hybrid cache apparatus of claim 1, configured for storing critical words of cached information in the first memory location.

4. The hybrid cache apparatus of claim 1, in which the second type of memory comprises a resistive memory.

5. The hybrid cache apparatus of claim 1, in which the first type of memory comprises a static random access memory (SRAM), and the second type of memory comprises a magnetic random access memory (MRAM).

6. The hybrid cache apparatus of claim 1, further comprising:
a second memory bank including the first type of memory and the second type of memory.

7. The hybrid cache apparatus of claim 1, further comprising:
a second cache line including a third memory location in the first type of memory and a fourth memory location in the second type of memory, the second cache line configured for accessing the third memory location before accessing the second memory location during the cache accessing operation.

8. The hybrid cache apparatus of claim 1, integrated in a mobile phone, a set top box, a music player, a video player, an entertainment unit, a navigation device, a computer, a hand-held personal communication systems (PCS) unit, a portable data unit, and/or a fixed location data unit.

9. A method for accessing a hybrid cache apparatus, comprising:

storing a first portion of cached information in a first type of memory of a first cache line within a first memory bank;
storing a second portion of the cached information in a second type of memory of the first cache line within the first memory bank; and
accessing the first portion of the cached information before accessing the second portion of the cached information within the first memory bank during a cache accessing operation.

10. The method of claim 9, in which the second type of memory comprises a resistive memory.

11. The method of claim 9, in which the first type of memory comprises a static random access memory (SRAM), and the second type of memory comprises a magnetic random access memory (MRAM).

12. The method of claim 11, further comprising storing critical words of the cached information in the SRAM of the first cache line.

13. The method of claim 9, in which accessing the first portion occurs before the second type of memory reaches a ready state.

14. The method of claim 9, further comprising:
storing a third portion of cached information in the first type of memory of a second cache line;
storing a fourth portion of the cached information in the second type of memory of the second cache line; and
accessing the third portion of the cached information before accessing the second portion of the cached information during the cache accessing operation.

15. The method of claim 9, further comprising integrating the hybrid cache apparatus into a mobile phone, a set top box, a music player, a video player, an entertainment unit, a navigation device, a computer, a hand-held personal communication systems (PCS) unit, a portable data unit, and/or a fixed location data unit.

16. A hybrid cache apparatus, comprising:
means for storing a first portion of cached information in a static random access memory (SRAM) location of a first cache line;
means for storing a second portion of the cached information in a resistive random access memory portion of the first cache line;
a first memory bank including the means for storing the first portion and the means for storing the second portion; and
means for accessing the first portion of the cached information before accessing the second portion of the cached information within the first memory bank during a cache accessing operation.

17. The hybrid cache apparatus of claim 16, further comprising:
means for storing critical words of the cached information in the SRAM location of the first cache line.

18. The hybrid cache apparatus of claim 16, further comprising:
a second memory bank including the means for storing the first portion and means for storing the second portion.

19. The hybrid cache apparatus of claim 16, further comprising:
means for storing a third portion of cached information in the static random access memory (SRAM) location of a second cache line;
means for storing a fourth portion of the cached information in a resistive random access memory portion of the second cache line; and means for accessing the third portion of the cached information before accessing the second portion of the cached information during the cache accessing operation.

20. The hybrid cache apparatus of claim 16, integrated in a mobile phone, a set top box, a music player, a video player, an entertainment unit, a navigation device, a computer, a handheld personal communication systems (PCS) unit, a portable data unit, and/or a fixed location data unit.

* * * * *